(12) United States Patent
Lin et al.

(10) Patent No.: US 7,449,386 B2
(45) Date of Patent: Nov. 11, 2008

(54) MANUFACTURING METHOD FOR SEMICONDUCTOR DEVICE TO MITIGATE SHORT CHANNEL EFFECTS

(75) Inventors: Chung-Te Lin, Tainan (TW); Di-Houng Lee, Austin, TX (US); Yee-Chaung See, Dallas, TX (US)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 29 days.

(21) Appl. No.: 11/600,030

(22) Filed: Nov. 16, 2006

(65) Prior Publication Data
US 2008/0119023 A1  May 22, 2008

(51) Int. Cl.
*H01L 21/336* (2006.01)
(52) U.S. Cl. .................. 438/302; 438/301; 438/305; 438/306; 257/E21.437; 257/E21.345
(58) Field of Classification Search .............. 438/301, 438/302, 305, 306; 257/E21.437, E21.345
See application file for complete search history.

(56) References Cited

U.S. PATENT DOCUMENTS

| | | | |
|---|---|---|---|
| 5,278,078 A * | 1/1994 | Kanebako et al. | 438/276 |
| 5,739,058 A | 4/1998 | Karniewicz et al. | |
| 6,008,093 A * | 12/1999 | Aoki et al. | 438/276 |
| 6,242,329 B1 | 6/2001 | Huster et al. | |
| 6,358,787 B2 | 3/2002 | Dennison et al. | |
| 6,372,587 B1 | 4/2002 | Cheek et al. | |
| 6,458,665 B1 | 10/2002 | Kim | |
| 6,503,789 B1 * | 1/2003 | Kim et al. | 438/232 |
| 6,645,806 B2 | 11/2003 | Roberts | |
| 6,777,351 B1 * | 8/2004 | Hill | 438/783 |
| 6,794,235 B1 | 9/2004 | Liu et al. | |
| 6,940,137 B2 | 9/2005 | Chen et al. | |
| 2002/0020891 A1 | 2/2002 | Madurawe et al. | |
| 2003/0124788 A1 | 7/2003 | Roberts | |
| 2003/0209758 A1 * | 11/2003 | Lee et al. | 257/336 |
| 2004/0157397 A1 | 8/2004 | Quek | |
| 2005/0093083 A1 | 5/2005 | Hiraizumi | |
| 2005/0136607 A1 | 6/2005 | Kim | |
| 2005/0142782 A1 | 6/2005 | Kim | |

OTHER PUBLICATIONS

Buti et al., "A New Asymmetrical Halo Source Gold Drain (HS-Gold) Deep Sub-Half-Micrometer n-MOSFET Design for Reliability and Performance", IEEE Transactions on Electron Devices, vol. 38, No. 8, pp. 1757-1764, Aug. 1991.

(Continued)

*Primary Examiner*—Andy Huynh
(74) *Attorney, Agent, or Firm*—Finnegan, Henderson, Farabow, Garrett & Dunner LLP

(57) ABSTRACT

A method of manufacturing a plurality of MOS transistors includes forming gate structures in first and second regions on a substrate and forming mask portions only between adjacent drain sides of the respective gate structures only in the first region. Dopant of a first conductivity type that is the same as that of the substrate, is implanted at first and second angles in both the first and second regions to form halo regions only in source sides under the gate structures in the first region and in both source and drain sides under the gate structures in the second region.

18 Claims, 3 Drawing Sheets

OTHER PUBLICATIONS

Jung et al., "A 0.25 mu m Complementary Metal Oxide Semiconductor Field Effect Transistor (CMOSFET) Using Halo Implantation for 1 Gbit Dynamic Random Access Memory (DRAM)", Japanese Journal of Applied Physics, Part. 1 (Regular Papers & Short Notes), vol. 35, No. 2B, pp. 865-868, Feb. 1996. (Abstract only).

Miyamoto et al., "An Asymmetrically Doped Buried-Layer (ADB) Structure for Low-Voltage Mixed Analog-Digital CMOS LSI's", IEEE Transactions on Electron Devices, vol. 46, No. 8 pp. 1699-1704, Aug. 1999.

Hook et al., "High-Performance Logic and High-Gain Analog CMOS Transistors Formed by a Shadow-Mask Technique with a Single Implant Step", IEEE Transaction on Electron Devices, vol. 49, No. 9, pp. 1623-1627, Sep. 2002.

Lenbole et al., "Impact of Tilt Angle Variation on Device Performance", 2002 14th International Conference on Ion Implantation Technology Proceedings, pp. 44-47, 2003.

Zhao et al., "Ion Implantation Angle Variation to Device Performance and the Control in Production", AIP Conference Proceedings, vol. 680, No. 1, pp. 666-669, Aug. 26, 2003.

Genshu, "The Ion Implantation Equipment", Denshi Zairyo (Electronic Parts and Materials), 12 gatsugo bessatsu, pp. 112-117, 2004. (Abstract only).

* cited by examiner

MANUFACTURING METHOD FOR SEMICONDUCTOR DEVICE TO MITIGATE SHORT CHANNEL EFFECTS

TECHNICAL FIELD

The present invention generally relates to methods for manufacturing semiconductor devices and, more particularly, for manufacturing methods to introduce features that mitigate short channel efforts in MOS transistors.

The basic structure of a metal oxide semiconductor field effect transistor (hereafter "MOS transistor") includes a gate overlying a channel in a semiconductor substrate doped with a first conductivity type dopant (or in a well formed in a substrate, the well being doped with the first conductivity type dopant). The channel lies between source and drain regions doped with a second conductivity type dopant opposite the first type dopant. In an NMOS transistor, the substrate (or well) is doped p-type, while the source and drain are doped n-type. In a PMOS transistor, the substrate (or well) is doped n-type, while the source and drain are doped p-type.

There is an ongoing trend to decrease the size of integrated circuit devices, including MOS transistors, in order to, among other things, increase operating speed. As MOS transistors are made smaller, gate widths of the transistors get smaller. As a result, the length of the channel also decreases. Decreasing channel length should increase operating speed, assuming other parameters are held constant.

As channel length is decreased, however, short channel effects may increase. These effects include an increased potential for charges to punch through the source and drain regions and thereby cause a flow of an undesirable leakage current in the channel, even when the transistor is supposed to be "off." One conventional technique for reducing short channel effects is to introduce a lightly doped drain (LDD) implant in each of the source and drain regions.

FIGS. 1A and 1B diagrammatically illustrate exemplary portions of a process to fabricate an MOS transistor 100 formed in a substrate (or well) 102, e.g., a silicon substrate. A gate structure 103 of MOS transistor 100 includes a gate oxide 104 formed on substrate 102 and a conductive gate electrode 106 formed of, e.g., polysilicon, on gate oxide 104. LDD regions 108 are formed on opposite sides of a channel region 110 that underlies gate structure 103. LDD regions 108 may be formed by a shallow implant, by ion implantation, of dopant with a conductivity type dopant opposite to that of the substrate. The shallowness of the implant is determined by the mass of the dopant and the energy used in the ion implantation process. LDD regions 108 are intended to reduce leakage current.

Another conventional technique for reducing short channel effects is to introduce one or two halo dopant implants in channel region 110 near one or both of LDD regions 108. Halo dopant implants are of the same conductivity type as the substrate but of a relatively low dosage. Each halo implant is intended to strengthen the doping of the substrate in the channel region to thereby reduce leakage current. FIG. 1A illustrates a halo implant 112 at a source end of MOS transistor 100 and in contact with LDD region 108. A transistor having one halo implant is referred to as asymmetric. A second halo implant can also be implanted at the drain end of the MOS transistor and in such case the transistor is referred to as symmetric. An optional second halo implantation 114 is also shown in FIG. 1A.

Each halo implantation 112, 114 is located underneath gate structure 103. The halo implantation is performed at a non-zero angle defined relative to the plane of or a normal to substrate 102. This angled implantation may be achieved by either tilting the wafer or the ion implantation device during fabrication.

FIG. 1B illustrates the results of subsequent process steps in which insulative sidewall spacers 120 are formed on the sides of gate structure 103. In accordance with one conventional processing technique, a source region 122 and a drain region 124 may be formed next by implantation using sidewall spacers 120 to protect channel 110 from dopant during the implantation. Source region 122 and drain region 124 are formed with dopant of the same conductivity type as LDD regions 108, but with a larger dosage and greater depth of implantation. FIGS. 1A and 1B do not illustrate formation of all features necessary for a complete MOS transistor. For example, device isolation regions and metal contacts for electrical connection to and interconnection between devices such as MOS transistor 100 are not illustrated.

When halo implants are formed, the doping concentration in the channel region is increased, and the depletion regions of the drain and source regions are narrowed and spaced farther apart from each other. As a result, short channel effects, including punch-through, are mitigated. However, because of the increased doping concentration in the channel region and the narrowed depletion regions, transistors with halo implants exhibit higher band-to-band tunneling leakage currents. Therefore, although symmetric transistors have minimized short channel effects, asymmetric halo implants, i.e., only one halo implant adjacent to the source region, may better achieve a balance between reduced short channel effects and increased tunneling leakage currents. Sometimes both symmetric and asymmetric transistors are required in a circuit, in which case multiple implantation masks are required for the halo implantations. For example, as many as three implantation masks may be needed for forming halo implants, including a first implantation mask for forming the halo implants of the symmetric transistors, a second implantation mask for forming the halo implants in the asymmetric transistors where the source regions are on one side, e.g., the right side, of the gate structures, and a third implantation mask for forming the halo implants in the asymmetric transistors where the source regions are on the other side, e.g., the left side, of the gate structures. Such extra mask processes increase the overall fabrication time and entail additional expense.

SUMMARY OF THE INVENTION

A method of manufacturing a plurality of MOS transistors consistent with embodiments of the present invention includes providing at least a portion of a semiconductor substrate of a first conductivity type having first and second regions; forming a plurality of gate structures in each of the first and second regions, each gate structure having defined with respect thereto source and drain region sides and a channel region under the gate structure, respective drain sides of immediately adjacent ones of the gate structures being adjacent one another; forming a mask layer only on the first region and not on the second region of the substrate, the mask layer having mask portions that only partially mask portions of the substrate between the respective drain sides of the gate structures only in the first region; implanting dopant of the first conductivity type at first and second respectively positive and negative predetermined non-zero degree tilt angles relative to a normal perpendicular to the substrate using the mask layer as an implantation mask; implanting dopant of a second conductivity type, opposite the first conductivity type, into both the first and second regions of the substrate at a 0 degree angle relative to the normal to the substrate; and implanting dopant of the second conductivity type into the first and second regions of the substrate at third and fourth respectively positive and negative angles relative to the normal perpendicular to the substrate using the mask layer as an implantation mask.

A method of manufacturing a plurality of MOS transistors consistent with embodiments of the present invention includes providing at least a portion of a semiconductor substrate of a first conductivity type having first and second regions; forming a plurality of gate structures in each of the first and second regions, each gate structure having defined with respect thereto source and drain region sides and a channel region under the gate structure, respective drain sides of immediately adjacent ones of the gate structures being adjacent one another; forming a mask layer only on the first region and not on the second region of the substrate, the mask layer having mask portions that only partially mask portions of the substrate between the respective drain sides of the gate structures only in the first region; forming halo regions under ones of the gate structures by implanting dopant of the first conductivity type at first and second respectively positive and negative predetermined non-zero degree tilt angles relative to a normal perpendicular to the substrate using the mask layer as an implantation mask; forming first lightly doped drain portions by implanting dopant of a second conductivity type, opposite the first conductivity type, into both the first and second regions of the substrate at a 0 degree angle relative to the normal to the substrate; and forming second lightly doped drain portions by implanting dopant of the second conductivity type into the first and second regions of the substrate at third and fourth respectively positive and negative angles relative to the normal perpendicular to the substrate using the mask layer as an implantation mask.

Additional features and advantages of the invention will be set forth in the description that follows, being apparent from the description or learned by practice of the invention. The features and other advantages of the invention will be realized and attained by the semiconductor device structures and methods of manufacture particularly pointed out in the written description and claims, as well as the appended drawings.

It is to be understood that both the foregoing general description and the following detailed description are exemplary and explanatory, and are intended to provide further explanation of the invention as claimed.

BRIEF DESCRIPTION OF THE DRAWINGS

The accompanying drawings, which are incorporated in and constitute a part of this specification, illustrate embodiments of the invention and, together with the description, serve to explain the features, advantages, and principles of the invention.

DETAILED DESCRIPTION OF THE EMBODIMENTS

Reference will now be made in detail to embodiments of the present invention, examples of which are illustrated in the accompanying drawings. Wherever possible, the same or similar reference numbers will be used throughout the drawings to refer to the same or like parts.

Figure 1A:
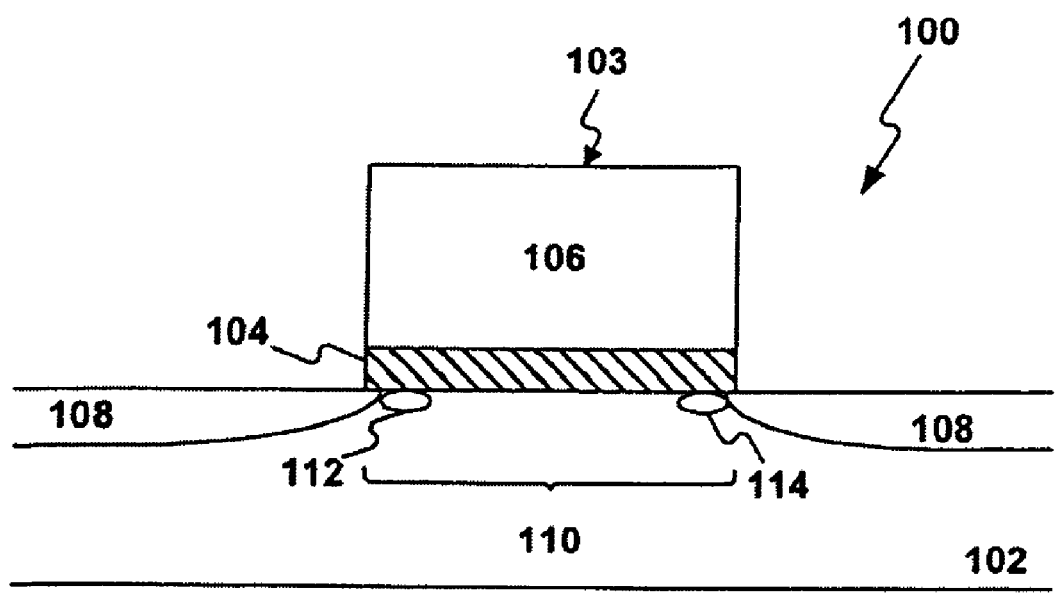
FIGS. 1A and 1B diagrammatically illustrate exemplary portions of a process to fabricate an MOS transistor.
Figure 1B:
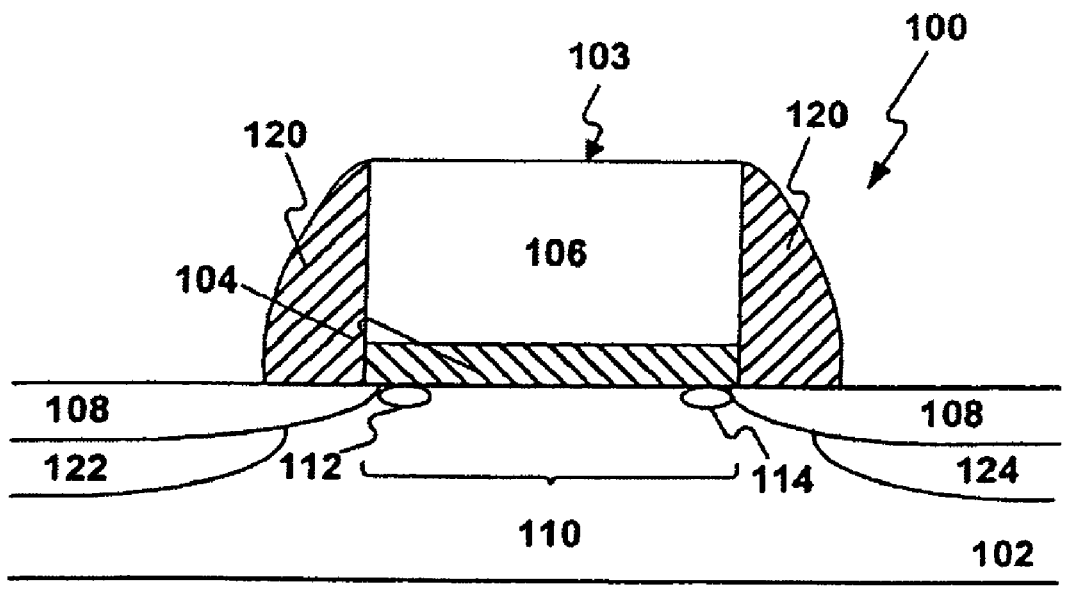
Figure 2:
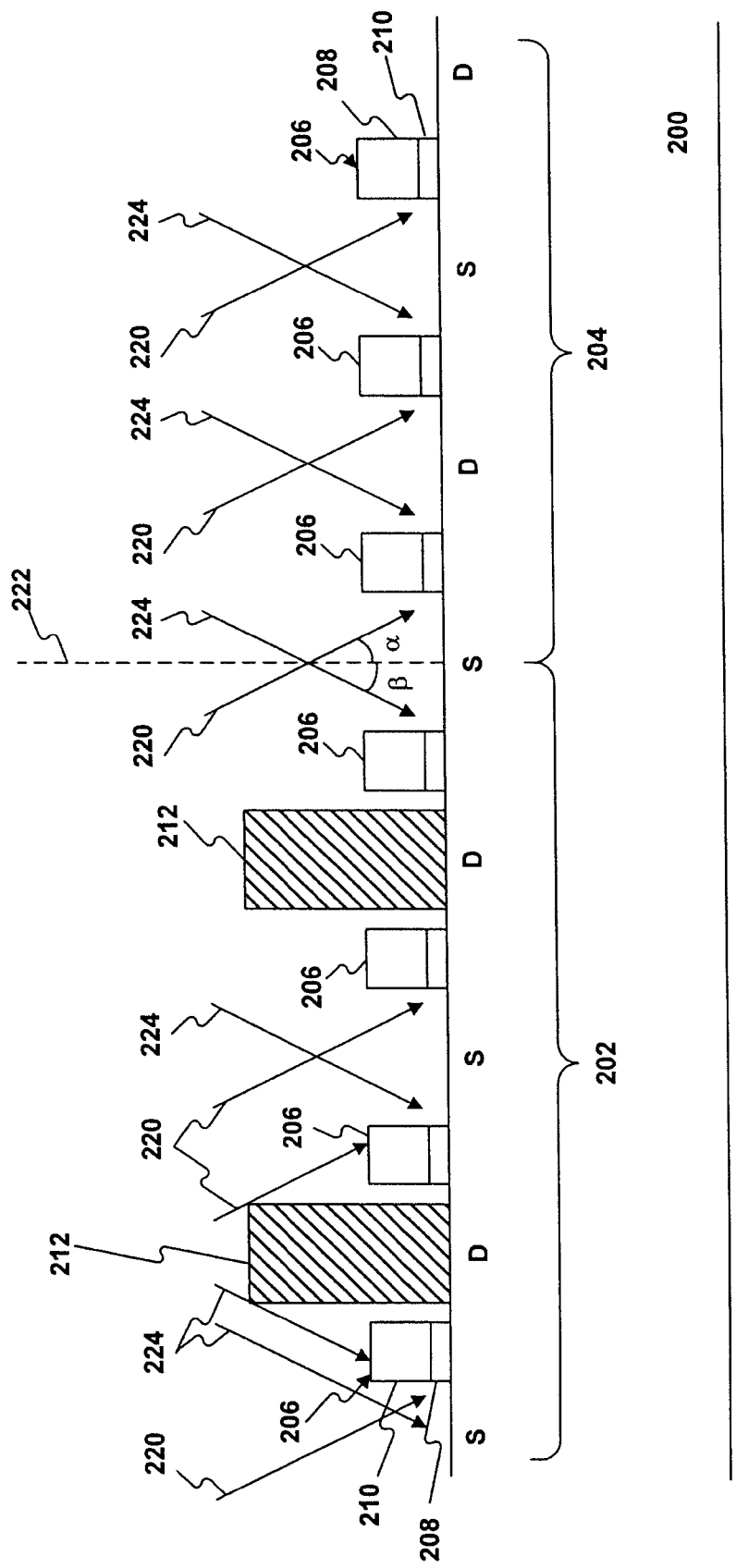
FIG. 2 illustrates a portion of a process for fabricating MOS transistors consistent with embodiments of the present invention.

FIG. 2 illustrates a portion of a process in which a plurality of MOS transistors, including both asymmetric and symmetric transistors, are being formed in a substrate 200. The MOS transistors formed in a first region 202 will each be asymmetric. The MOS transistors formed in a second region 204 will each be symmetric. At the stage of the process shown in FIG. 2, partial gate structures 206 have been formed for the respective MOS transistors. Partial gate structures 206 may be either gate structures as part of transistors or dummy gate structures to be replaced in later processing steps. Each partial gate structure 206 includes a gate oxide 208 and a gate conductive structure 210 of, e.g., polysilicon. All of the MOS transistors being formed in FIG. 2 are of the same conductivity type, e.g., all are NMOS transistors or all are PMOS transistors. The process steps described herein are intended to simultaneously form features in all of the MOS transistors of the same conductivity type.

FIG. 2 further illustrates that the MOS transistors being formed are arranged and defined with their respective source "S" and drain "D" regions adjacent one another. As a result, respective drain region "D" sides of immediately adjacent ones of gate structures 206 are adjacent one another. Similarly, respective source region "S" sides of immediately adjacent ones of gate structures 206 are adjacent one another.

A layer of photoresist is deposited and patterned on the surface of substrate 200 to form a mask which includes portions 212 only partially cover drain regions "D" of the MOS transistors in first region 202.

Following formation of mask portions 212, a first halo implantation is performed at a first predetermined angle $\alpha$ relative to substrate 200. The first halo implantation is represented by arrows 220. The angle $\alpha$ is arbitrarily defined relative to a normal 222 to substrate 200 and is non-zero. The angle of the first halo implantation could instead be defined relative to the planar surface of substrate 200 and would then be the complement of angle $\alpha$. The first halo implantation effects a relatively shallow implantation of dopant of the same conductivity type as that of substrate 200. Angle $\alpha$ is selected to position the halo implantation at least under the source side of gate structures 206 in first region 202 accessible at angle $\alpha$ and the source and drain sides of gate structures 206 accessible at angle $\alpha$ in second region 204.

With mask portions 212 still in place, a second halo implantation is performed at a second predetermined angle $\beta$ relative to substrate 200. The second halo implantation is represented by arrows 224. Like angle $\alpha$, angle $\beta$ is arbitrarily defined relative to normal 222 to substrate 200, although it could also be defined relative to the planar surface of substrate 200. As seen in FIG. 2, angle $\beta$ is formed in a direction relative to normal 222 that is opposite a direction of angle $\alpha$ relative to normal 222, such that angles $\alpha$ and $\beta$ are arbitrarily defined herein as being positive and negative, respectively, with respect to normal 222. Angles $\alpha$ and $\beta$ can be selected to have the same magnitude, while being respectively positive and negative with respect to normal 222. The second halo implantation effects a relatively shallow implantation of dopant of the same conductivity type as that of substrate 200. Angle $\beta$ is selected to position the halo implantation under the source sides of gate structures 206 in first region 202 accessible at angle $\beta$ and the source and drain sides of gate structures 206 accessible at angle $\beta$ in second region 204.

Mask portions 212 block the first and second halo implantations from implanting dopant in drain regions of the MOS transistors being formed in first region 202. In order to effectively block halo implantations in the drain regions in first region 202, mask portions 212 are formed to have a sufficient height and width to block the implantation at angles α and β. The respective magnitudes of angles α and β are selected to appropriately position the halo implantation under the source side of each gate structure 206 in both first region 202 and second region 204 and under the drain side of each gate structure in second region 204.

In one aspect, the first and second halo implantations may be replaced with one single halo implantation, in which case α and β have the same magnitude. Particularly, with mask portions 212 in place, substrate 200 may be rotated during the halo implantation such that ions are implanted from all directions into the source side of gate structures 206 in first region 202 and both the source and drain sides of gate structures 206 in second region 204.

Figure 3:
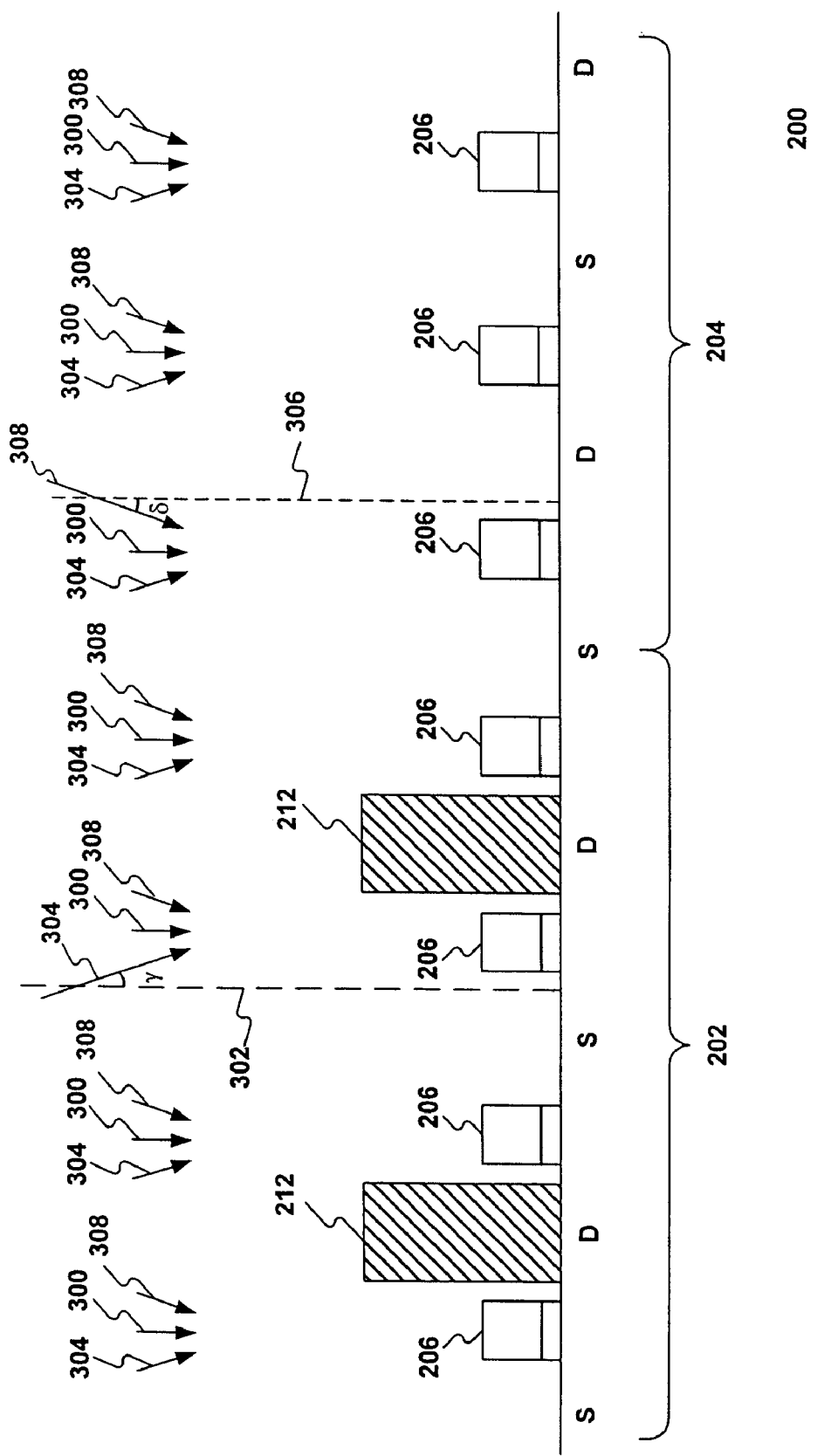
FIG. 3 illustrates further portions of the fabrication process illustrated in FIG. 2.

With reference to FIG. 3 and with mask portions 212 still in place, a first LDD implantation is performed next in order to implant a light dosage of dopant having a conductivity type opposite to that of substrate 200. The first LDD implantation is performed normal to substrate 200 and is represented by arrows 300. The first LDD implantation is intended to reach regions adjacent each gate structure 206 on both the source and drain region sides of gate structures 206 in both first region 202 and second region 204. Mask portions 212 are sized and located to provide a sufficient space between each gate structure 206 and mask portion 212 on the drain side to enable the first LDD implantation to reach the substrate adjacent gate structures 206 in first region 202.

With mask portions 212 still in place, a second LDD implantation is performed to implant a light dosage of dopant having the same conductivity type as the first LDD implantation. The second LDD implantation is performed at a predetermined angle γ arbitrarily defined relative to a normal 302 to substrate 200 and is represented by arrows 304. The second LOD implantation is intended to expand the LDD region into the channel region from the source side of gate structures 206 of the MOS transistors in first region 202 accessible at angle γ and the source and drain sides of gate structures 206 accessible at angle γ in second region 204. The second LDD implantation is blocked from the drain sides of gate structures 206 of the MOS transistors in first region 202.

With mask portions 212 still in place, a third LDD implantation is performed to implant a light dosage of dopant having the same conductivity type as the first and second LDD implantations. The third LDD implantation is performed at a predetermined angle δ arbitrarily defined relative to a normal 306 to substrate 200 and is represented by arrows 308. As seen in FIG. 3, angle δ is formed in a direction relative to normal 222 that is opposite to a direction of angle γ relative to normal 302, such that angles γ and δ are arbitrarily defined herein as being positive and negative, respectively, with respect to normals 302 and 306. Angles γ and δ can be selected to have the same magnitude. The third LDD implantation is intended to expand the LDD region into the channel region from the source side of gate structures 206 of the MOS transistors in first region 202 accessible at angle δ and the source and drain sides of gate structures 206 accessible at angle δ in second region 204. The third LDD implantation is blocked from the drain sides of gate structures 206 of the MOS transistors in first region 202.

In one aspect, the second and third LDD implantations may be replaced with one single LDD implantation, in which case angles γ and δ have the same magnitude. Particularly, with mask portions 212 in place, substrate 200 may be rotated during the LDD implantation such that ions are implanted from all directions into the source side of gate structures 206 in first region 202 and both the source and drain sides of gate structures 206 in second region 204, while blocked from being implanted into the drain side of gate structures 206 in first region 202.

As a result of the processes described above with respect to FIGS. 2 and 3, halo regions are implanted both symmetrically and asymmetrically and LDD regions are also implanted, all using the same photoresist pattern. As a result, no extra process steps are required to remove masks and form additional masks, and the process steps can be performed more quickly and economically. Also, compared to conventional methods described above, fewer ion implantation steps are required to form the halo regions, both symmetrically and asymmetrically, and the LDD regions.

By way of example and without limitation, exemplary dopants, implantation energies and angles are provided next for devices formed in a silicon substrate. For fabrication of an NMOS transistor in a p-type silicon substrate, the halo regions can be implanted using boron as a dopant at an energy of 7 KeV and a dosage of $8 \times 10^{12}$ cm$^{-2}$ or using indium as a dopant at an energy of 40 KeV and a dosage of $2 \times 10^{13}$ cm$^{-2}$. The angles α or β of implantation relative to normal 222 can be in the range of 20-30 degrees or, alternatively, 25-30 degrees. Each of the LDD implantations can be performed using arsenic as a dopant at an energy of 3 KeV. The dosage of the LDD implantations at each of angles γ or δ can be $3 \times 10^{14}$ cm$^{-2}$. The dosage of the LDD implantation normal to substrate 200 can be $4 \times 10^{14}$ cm$^{-2}$. The angles γ or δ of implantation relative to normals 304 or 308, respectively, can be in the range of 10-25 degrees.

For fabrication of a PMOS transistor in an n-type silicon substrate, the halo regions can be implanted using arsenic as a dopant at an energy of 50 KeV and a dosage of $1.5 \times 10^{13}$ cm$^{-2}$. The angles α and β can be in the same ranges noted above for fabrication of an NMOS transistor. Each of the LDD implantations for fabricating a PMOS transistor can be performed using boron fluoride as a dopant at an energy of 3 KeV and a dosage of $1 \times 10^{14}$ cm$^{-2}$. The angles γ or δ can be in the same ranges noted above for fabrication of an NMOS transistor.

Also by way of example and without limitation, an exemplary range of spacing between each mask portion 212 and each adjacent gate structure is 30-100 nm.

While embodiments have been described in which halo implantations are performed before LDD implantations, the invention is not so limited. The LDD implantations can be performed before the LDD implantations. Further, the first and second halo implantations can be performed in the opposite order with the second implantation being performed first. Additionally, the three LDD implantations can be performed in any order.

It will be apparent to those skilled in the art that various modifications and variations can be made in the disclosed structures and methods without departing from the scope or spirit of the invention. Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

We claim:

1. A method of manufacturing a plurality of MOS transistors, comprising:
   providing at least a portion of a semiconductor substrate of a first conductivity type having first and second regions;
   forming a plurality of gate structures in each of the first and second regions, each gate structure having defined with respect thereto source and drain region sides and a channel region under the gate structure, respective drain sides of immediately adjacent ones of the gate structures being adjacent one another;

forming a mask layer only on the first region and not on the second region of the substrate, the mask layer having mask portions that only partially mask portions of the substrate between the respective drain sides of the gate structures only in the first region;

implanting dopant of the first conductivity type at first and second respectively positive and negative predetermined non-zero degree tilt angles relative to a normal perpendicular to the substrate using the mask layer as an implantation mask;

implanting dopant of a second conductivity type, opposite the first conductivity type, into both the first and second regions of the substrate at a 0 degree angle relative to the normal to the substrate; and implanting dopant of the second conductivity type into the first and second regions of the substrate at third and fourth respectively positive and negative angles relative to the normal perpendicular to the substrate using the mask layer as an implantation mask.

2. The method of claim 1, wherein implanting dopant of the first conductivity type includes implanting the first conductivity type dopant only in the respective source sides of the gate structures in the first region because the mask portions block implantation at the first and second angles in the respective drain sides of the gate structures in the first region.

3. The method of claim 1, wherein the respective magnitudes of the first and second angles are substantially equal.

4. The method of claim 1, wherein the respective magnitudes of the third and fourth angles are substantially equal.

5. The method of claim 3, wherein the respective magnitudes of the third and fourth angles are substantially equal.

6. The method of claim 1, wherein each of the first and second angles is in a range of 20-30 degrees.

7. The method of claim 1, wherein each of the third and fourth angles is in a range of 10-15 degrees.

8. The method of claim 1, wherein the first and second conductivity types are p-type and n-type, respectively.

9. The method of claim 8, wherein implanting dopant of the first conductivity type at the first and second angles includes implanting one of boron and indium.

10. The method of claim 8, wherein implanting dopant of the second conductivity type at the third and fourth angles includes implanting arsenic.

11. The method of claim 1, wherein the first and second conductivity types are n-type and p-type, respectively.

12. The method of claim 11, wherein implanting dopant of the first conductivity type at the first and second angles includes implanting arsenic.

13. The method of claim 11, wherein implanting dopant of the second conductivity type at third and fourth angles includes implanting boron fluoride.

14. The method of claim 1, wherein the first and second angles have the same magnitude, and implanting dopant of the first conductivity type at first and second angles includes implanting the dopant of the first conductivity type at the first angle while rotating the semiconductor substrate.

15. The method of claim 1, wherein the third and fourth angles have the same magnitude, and implanting dopant of the second conductivity type at the third and fourth angles includes implanting the dopant of the second conductivity type at the third angle while rotating the semiconductor substrate.

16. The method of claim 1, wherein implanting dopant of the second conductivity type includes implanting the second conductivity type dopant only in the respective source sides of the gate structures in the first region because the mask portions block implantation at the third and fourth angles in the respective drain sides of the gate structures in the first region.

17. A method of manufacturing a plurality of MOS transistors, comprising:

providing at least a portion of a semiconductor substrate of a first conductivity type having first and second regions;

forming a plurality of gate structures in each of the first and second regions, each gate structure having defined with respect thereto source and drain region sides and a channel region under the gate structure, respective drain sides of immediately adjacent ones of the gate structures being adjacent one another;

forming a mask layer only on the first region and not on the second region of the substrate, the mask layer having mask portions that only partially mask portions of the substrate between the respective drain sides of the gate structures only in the first region;

forming halo regions under ones of the gate structures by implanting dopant of the first conductivity type at first and second respectively positive and negative predetermined non-zero degree tilt angles relative to a normal perpendicular to the substrate using the mask layer as an implantation mask;

forming first lightly doped drain portions by implanting dopant of a second conductivity type, opposite the first conductivity type, into both the first and second regions of the substrate at a 0 degree angle relative to the normal to the substrate; and forming second lightly doped drain portions by implanting dopant of the second conductivity type into the first and second regions of the substrate at third and fourth respectively positive and negative angles relative to the normal perpendicular to the substrate using the mask layer as an implantation mask.

18. The method of claim 17, wherein implanting halo regions includes implanting the halo regions only in the respective source sides of the gate structures in the first region because the mask portions block implantation at the first and second angles in the respective drain sides of the gate structures in the first region.

* * * * *